United States Patent
Rueb et al.

(10) Patent No.: US 7,821,064 B2
(45) Date of Patent: Oct. 26, 2010

(54) LATERAL MISFET AND METHOD FOR FABRICATING IT

(75) Inventors: Michael Rueb, Faak Am See (AT);
Markus Schmitt, Neukeferloh (DE);
Carolin Tolksdorf, Steinhoering (DE);
Uwe Wahl, München (DE); Armin Willmeroth, Augsburg (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 11/276,782

(22) Filed: Mar. 14, 2006

(65) Prior Publication Data
US 2006/0261384 A1    Nov. 23, 2006

(30) Foreign Application Priority Data
Mar. 15, 2005    (DE) ....................... 10 2005 012 217

(51) Int. Cl.
*H01L 29/00*    (2006.01)
(52) U.S. Cl. ........................ 257/343; 257/213; 257/288; 257/342; 257/E29.256; 257/E29.261; 438/197
(58) Field of Classification Search ................. 257/342, 257/E29.049–E29.051, 213, 288, 343, E29.256, 257/E29.261; 438/197
See application file for complete search history.

(56) References Cited

U.S. PATENT DOCUMENTS

| | | | | |
|---|---|---|---|---|
| 4,412,376 A | * | 11/1983 | De Bar et al. | 438/326 |
| 4,482,907 A | * | 11/1984 | Jay | 257/284 |
| 4,831,423 A | * | 5/1989 | Shannon | 257/141 |
| 4,881,979 A | * | 11/1989 | Lewis | 136/249 |
| 5,111,254 A | * | 5/1992 | Levinson et al. | 257/261 |
| 5,629,543 A | * | 5/1997 | Hshieh et al. | 257/330 |
| 6,194,755 B1 | * | 2/2001 | Gambino et al. | 257/301 |
| 6,326,656 B1 | * | 12/2001 | Tihanyi | 257/288 |

(Continued)

FOREIGN PATENT DOCUMENTS

DE    198 15 907 C1    5/1999

(Continued)

OTHER PUBLICATIONS

Saito, Waturu, et al; A Novel Low On-Resistance Schottky-Barrier Diode with p-Buried Floating Layer Structure; IEEE Transactions on Electron Devices; vol. 51, No. 5, May 2004.

*Primary Examiner*—Matthew E Warren
*Assistant Examiner*—John Lin
(74) *Attorney, Agent, or Firm*—Coats & Bennett, P.L.L.C.

(57) ABSTRACT

A lateral MISFET having a semiconductor body has a doped semiconductor substrate of a first conduction type and an epitaxial layer of a second conduction type, which is complementary to the first conduction type, the epitaxial layer being provided on the semiconductor substrate. This MISFET has, on the top side of the semiconductor body, a drain, a source, and a gate electrode with gate insulator. A semiconductor zone of the first conduction type is embedded in the epitaxial layer in a manner adjoining the gate insulator, a drift zone of the second conduction type being arranged between the semiconductor zone and the drain electrode in the epitaxial layer. The drift zone has pillar-type regions which are arranged in rows and columns and whose boundary layers have a metal layer which in each case forms a Schottky contact with the material of the drift zone.

14 Claims, 3 Drawing Sheets

U.S. PATENT DOCUMENTS

| | | | |
|---|---|---|---|
| 6,707,088 B2 * | 3/2004 | Fishburn | 257/296 |
| 6,787,872 B2 * | 9/2004 | Kinzer et al. | 257/492 |
| 2004/0222461 A1 | 11/2004 | Peyre-Lavigne et al. | 257/333 |
| 2005/0082610 A1 * | 4/2005 | Shibib et al. | 257/335 |

FOREIGN PATENT DOCUMENTS

| | | |
|---|---|---|
| DE | 198 28 191 C1 | 7/1999 |
| EP | 0 201 945 B1 | 6/1993 |

* cited by examiner

LATERAL MISFET AND METHOD FOR FABRICATING IT

CROSS REFERENCE TO RELATED APPLICATION

This application claims priority to German application number 10 2005 012 217.5 filed Mar. 15, 2005.

TECHNICAL FIELD

The invention relates to a lateral MISFET having a semiconductor body comprising a doped semiconductor substrate of a first conduction type and comprising an epitaxial layer of a second conduction type, which is complementary to the first conduction type, the epitaxial layer being provided on the semiconductor substrate. The lateral MISFET furthermore has a drain electrode, a source electrode and a gate electrode. These are arranged on the top side of the semiconductor body, the gate electrode additionally having a gate insulator between gate electrode and semiconductor body.

BACKGROUND

Furthermore, the semiconductor body has a semiconductor zone of the first conduction type, which semiconductor zone adjoins the gate insulator and is embedded into the epitaxial layer and is also called body zone and in which semiconductor zone the MISFET channel extends beneath the gate insulator. A drift zone of the second conduction type extends between the source electrode or the body zone and the drain electrode in the epitaxial layer. The length of said drift zone is critical for the dielectric strength of the lateral MISFET. However, the on resistance of lateral MISFETs of this type is actually increased as the drift path becomes greater and the possible reverse voltage thus becomes higher.

The document DE 198 28 191 C1 discloses a lateral MISFET of this type, this MISFET, which is referred to as a lateral high-voltage transistor, having a semiconductor body whose semiconductor substrate is weakly doped with the first conduction type. In the case of the known lateral high-voltage transistor, the epitaxial layer has pillar-type trenches in the epitaxial layer that are arranged in rows and columns in the drift zone between the source electrode and the drain electrode, the trench walls being highly doped with a dopant of the first conduction type. A PN junction is thus formed with respect to the epitaxial layer having a complementary conduction type. The PN junction corresponds to the pillar structure of the trenches introduced into the drift zone.

These pillar structures are not completely depleted of free charge carriers during the taking-up of voltage in the off-state case. They can thus serially take up the potential that is attained with the expanding space charge zone between source and drain at the corresponding pillars. Consequently, the structure disclosed in the document DE 198 28 191 C1 realizes a voltage divider function which makes it possible to permit a higher doping for the drift zone and hence to reduce the on resistance of the MISFET. However, the introduction of highly doped pillar structures that are not depleted in the off-state case, particularly for high aspect ratios of the pillars, is difficult in terms of process engineering and cost-intensive under certain circumstances.

SUMMARY

It is an object of the invention to provide a lateral MISFET which is simple to fabricate and, despite high aspect ratios of the pillars, overcomes the abovementioned process engineering difficulties and enables the on resistance to be correspondingly reduced.

The present invention proposes realizing the pillar structure in the drift zone not by means of highly doped semiconductor regions, but rather by means of Schottky contacts. The latter can be realized by introducing metals that are customary in silicon technology. One particular advantage is that the metallic regions can never be completely depleted of charge carriers, in contrast to the highly doped regions in the compensation zones of the lateral MISFET disclosed in DE 198 28 191 C1.

Moreover, through a suitable choice of materials with optimization of the difference in work function between semiconductor material and metallic material, it is possible to realize a Schottky contact which practically achieves an advantageous effect analogous to that of the known PN junction arranged in the boundary region between semiconductor and compensation zones. Moreover, the fabrication of such regions with boundary layers comprising Schottky contacts in the wall regions is, under certain circumstances, simpler and more cost-effective to realize than the known diffused or ion-implanted structure of the compensation zones with highly doped material in the drift path of a MISFET.

According to the invention, the lateral MISFET thus has a semiconductor body comprising a doped semiconductor material of a first conduction type and comprising an epitaxial layer of a second conduction type, which is complementary to the first conduction type, said epitaxial layer being provided on the first semiconductor substrate. Furthermore, the MISFET has a drain electrode, a source electrode and a gate electrode with gate insulator.

In the specific case of a MOSFET, the gate insulator may comprise a thermally grown oxide of the semiconductor material. Particularly when the semiconductor material used is silicon, the thermal oxide of which is nonvolatile in contrast to other oxides of semiconductor materials. As already mentioned, the drift zone lies between the source electrode and the drain electrode which drift zone has the second conduction type and comprises epitaxial material and in which drift zone pillar-type regions arranged in rows and columns are present. According to the invention, the boundary layers have a material layer which in each case forms a Schottky contact with the material of the drift zone.

Consequently, the invention revolves around replacing and realizing the highly doped regions in the known lateral high-voltage transistor in the drift zone which serially assume the potential in the off-state case with which the space charge zone reaches the corresponding region by Schottky contacts.

In this case, the material layer which brings about the Schottky contact properties with respect to the semiconductor material or epitaxial material may be in multilayer form and have a combination of metals, silicides and/or polysilicides. Thus, in the case of an n-channel power MOSFET, the following metal compounds can advantageously form a Schottky contact with the semiconductor material. The corresponding preferred metal materials include aluminum, aluminum silicide, aluminum copper silicide, platinum and/or platinum silicide.

In order to increase the difference between the work function of charge carriers from the semiconductor material and the work function of charge carriers from the material of the material layer, the boundary layers of the regions may be specially prepared, for example by ions being implanted beforehand into the boundary layers. This ion implantation is not intended to serve for producing a PN junction as is provided in the prior art, but rather is intended advantageously to further propel the differences in the work functions of the semiconductor material and the metal layer material.

In one preferred embodiment of the invention, the pillar-type regions are alloyed into the drift zone. The boundary layers with respect to the drift zone have Schottky barriers in this case. It is furthermore provided that the pillar-type regions have trenches sunk into the drift zone, which trenches have, toward the material of the drift zone, walls coated with a metal, so that Schottky contacts are formed.

In a further preferred embodiment of the invention, the trenches have a second ply comprising metals, silicides and/or polysilicides as second metallic material filling the trenches. In this case, the transition from the material of the material layer which is arranged on the ends of the trenches for forming Schottky contacts need not form a further Schottky contact, but rather may lead to an ohmic contact.

In a further embodiment of the invention, it is provided that the material layers of the trenches that form Schottky contacts are coupled to one another in floating fashion. By contrast, in a further embodiment of the invention, the material layers of the trenches that form Schottky contacts are coupled to one another via a high-resistance connecting layer. High-resistance connecting layers of this type may be arranged both in the region of the top side of the semiconductor body or the epitaxial layer and as buried layer in the drift zone.

It is furthermore possible for the trenches to be configured in circular, oval, rectangular or polygonal fashion in cross section. In this case, the cross-sectional form only slightly influences the voltage divider properties of the trenches introduced into the drift zone. It may, however, affect the on resistance which is correspondingly improved the less volume of the drift zone is taken up by the trenches with their cross section.

In a further preferred embodiment of the invention, the gate electrode is arranged in planar fashion on the top side of the semiconductor body. In the case of gate electrodes of this type, the channel length that forms in the body zone is determined by the possibilities of the planar patterning of corresponding highly doped source regions and the drift zone between which the body zone and thus the channel in the body zone are formed.

In a further embodiment of the invention, the gate electrode is formed as gate trench electrode. The channel width can be increased with a gate trench electrode of this type. At the same time, it is possible to realize the thickness of the body zone and thus the channel length in the case of gate trench electrodes in the submicron range.

A method for fabricating a lateral MISFET has the following method steps. Firstly, an epitaxial layer is applied to a doped semiconductor substrate of a first conduction type. In this case, the epitaxial layer has a second conduction type, which is complementary to the first conduction type, and is patterned in the course of the method to form a drift zone of the lateral MISFET. This is followed by the introduction of a semiconductor zone as body zone, which has the first conduction type, into the epitaxial layer, the body zone then delimiting the drift zone on one side. Highly doped zones of the second conduction type are subsequently introduced in such a way that the first zone, which is intended to form the source region, is arranged in the body zone, while the second highly doped zone is introduced oppositely to the first zone as drain region into the epitaxial layer and thus constitutes a further delimitation of the drift zone.

The drift zone extends between the body zone and the drain zone after this production step. In a subsequent step, trenches having trench walls are then introduced into the drift zone in rows and columns. The trench walls are subsequently coated with a material layer which forms a Schottky contact with the semiconductor material of the epitaxial layer. The MIS structure of the lateral MISFET is finally completed with source, drain and gate electrodes being fitted onto the semiconductor body comprising semiconductor substrate and patterned epitaxial layer. This completion also includes supplying a gate insulator to the semiconductor body prior to the application of the gate electrode, or, in the case of gate trench electrodes, introducing a corresponding insulator into a gate trench provided before the gate electrode material in the form of metal or polysilicon is introduced into the gate trench. In this case, the gate trench depth is greater than the depth of the PN junction between body zone and drift zone.

On the other hand, the trenches may be introduced into the top side as early as at the wafer level, that is to say during the fabrication of the wafers. This has the advantage that the trenches for trench gate electrodes can be introduced in the same method step with the trenches for Schottky contacts.

In an alternative method for fabricating a lateral MISFET, in order to introduce the trenches into the epitaxial layer, at the top side of the epitaxial layer, material deposits are arranged in the region of the drift zone. By heating the semiconductor material, the deposit material can then be driven into the epitaxial layer with formation of virtually pillar-type trench-like Schottky contact regions projecting into the epitaxial layer. In one preferred implementation of the method, this drive-in may be effected by virtue of the fact that, during heating, locally delimited silicide micromelt droplets form the material of the material deposit and the material of the epitaxial layer, which, after cooling down, leave behind pillar-type trench-like Schottky contact regions in the drift zone.

In a further preferred embodiment of the invention, the body zone is introduced into the epitaxial layer by means of diffusion of defects and/or ion implantation of dopants. In this case, a corresponding diffusion and/or ion implantation mask is applied in patterned fashion to the top side of the semiconductor body, so that only the body zone provided can be formed.

Provision is furthermore made for introducing the first and the second highly doped zone of the second conduction type simultaneously into the body zone and into the epitaxial layer, respectively, by means of a step of diffusion and/or ion implantation of dopants. Both the drain region in the epitaxial layer and the source region in the body zone are thus realized simultaneously in a single production step.

The introduction of trenches into the epitaxial layer may be effected by means of wet etching; for this purpose, in a preparatory manner, those surface regions of the semiconductor body into which no trenches are to be etched are protected with the aid of a mask that is correspondingly resistant to the etchant. The trenches may also be introduced by a dry etching method e.g. by means of plasma etching, which has the advantage over wet etching that pillar-type trenches can be introduced anisotropically, with the result that even large aspect ratios can be realized. Furthermore, the trenches may also be introduced into the epitaxial layer by means of laser ablation, which likewise enables the trenches to be introduced anisotropically.

In order to construct Schottky contacts at the trench walls, a corresponding metal may be introduced by means of sputtering or by means of physical vapor deposition (PVD) or by means of chemical vapor deposition (CVD). Prior to such a deposition of a Schottky contact-forming material layer, the trench walls may be prepared by means of ion implantation or diffusion of defects in such a way that the difference between the work functions of charge carriers from the semiconductor material and from the metal layer is increased. The greater this difference in the work functions, the higher the blocking effect of the Schottky contacts that are formed in the boundary layer between metal and semiconductor material.

In a further preferred implementation of the method, a metal ply is applied to the Schottky contact-forming material layer, said metal ply filling the trenches with an ohmic contact with the material layer. This method has the advantage that for the purpose of filling the trenches after a Schottky contact has already been fabricated, relatively noncritical steps such as an electrode deposition or electroless deposition of metals can be carried out in order to fill the trenches with a material having good conductivity such as copper or alloys thereof.

BRIEF DESCRIPTION OF THE DRAWINGS

The invention will now be explained in more detail with reference to the accompanying figures.

DETAILED DESCRIPTION

Figure 1:
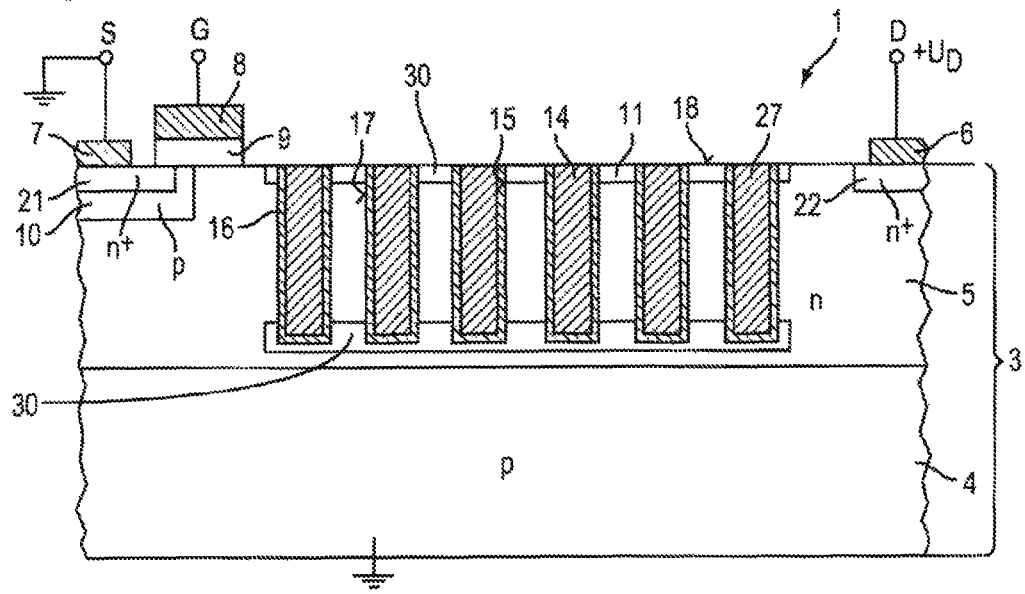
FIG. 1 shows a schematic cross section through a lateral MISFET of a first embodiment of the invention in the form of MOSFET with a planar gate electrode.

FIG. 1 shows a schematic cross section of a lateral MISFET of a first embodiment of the invention in the form of a MOSFET with a planar gate electrode 8. The MOSFET is arranged in a semiconductor body 3 made of monocrystalline silicon. The semiconductor body 3 has a substrate 4 made of a monocrystalline silicon with a weak doping between $1\times10^{14}$ to $1\times10^{16}$ cm$^{-3}$ of defects of a first conduction type, which is p-conducting in this embodiment of the invention. A monocrystalline epitaxial layer 5 having a complementary conduction type, in this case an n conduction type, is arranged on the p-conducting semiconductor substrate 4 made of monocrystalline silicon.

A semiconductor zone 10 is arranged at the top side 18 of the semiconductor body 3 or the epitaxial layer 5, on the left-hand side of FIG. 1, which semiconductor zone has been introduced by means of ion implantation and/or diffusion. Said semiconductor zone 10 is also called body zone and forms a PN junction with respect to the surrounding material of the epitaxial layer 5. A first highly doped zone 21 of the second conduction type is embedded into the body zone 10 and is connected via an ohmic contact with the source electrode 7 made of a material having good conductivity such as metal or highly doped polysilicon. A gate insulator 9 made of silicon dioxide is arranged above the body zone on the top side 18 of the semiconductor body, said gate insulator carrying the gate electrode 8.

On the right-hand side of this cross section of the MOSFET, a second highly doped zone 22 having a complementary conduction type is introduced into the n-conducting region of the epitaxial layer 5 and is contact-connected to the drain electrode 6. A drift zone 11 made of epitaxial material and having a conduction type—in this case n conduction type—of complementary conduction to that of the body zone 10 extends between the body zone 10 and the second highly doped zone 22 for the drain electrode 6. Mutually spaced apart pillar-type trenches 14 having trench walls 15 are introduced in the drift zone 11.

The trench walls 15 have a material layer 16 which forms a Schottky junction or a Schottky contact 17 with the semiconductor material of the epitaxial layer 5. These trenches 14 provided with Schottky contacts 17 divide the drift zone 11 into individual regions, so that the trenches 14 act like a voltage divider and serially assume the potential with which the space charge zone reaches the corresponding region of the respective Schottky contact 17. This embodiment of the invention is an N-channel power MOSFET for which the following material compounds are preferably taken into consideration as material layer 16 for the Schottky contact 17: aluminum, aluminum silicide, aluminum copper silicide, platinum, and also platinum silicide or a platinum alloy with silicon portions. There are various possibilities for the fabrication of pillar-type Schottky structures of this type.

Firstly, the trenches 14 may be etched into the drift zone 11 and they are subsequently filled with one of the abovementioned materials. For applying the material layer 16 and/or for filling the trenches 14 various methods can be used such as sputtering, physical vapor deposition (PVD), chemical vapor deposition (CVD), etc. Furthermore, it is possible, prior to the process of filling with a Schottky contact-forming material, to carry out an implantation in the respective trench region in order to influence the work function of the surrounding semiconductor region in a targeted manner.

Furthermore, it is possible to influence the work function of the filled metal by means of suitable measures, such as e.g. by means of corresponding metal alloys. Finally, provision is preferably made for applying the metals only on the surface of the semiconductor body 3 in the region of the drift zone 11 and then for driving them into the depth of the epitaxial layer 5 by means of a thermal step.

Combinations of metals, silicides and polysilicides are also used for realizing the Schottky contacts 17 in the trenches 14. In all these different implementations for fabricating Schottky contact regions in the drift zone, a high efficiency of the Schottky contacts in the drift zone can be achieved by setting the difference in work function to be as large as possible, whether by altering the work function of the surrounding semiconductor or by altering the work function of the Schottky region or by altering both work functions. On the other hand, it is also possible, in a targeted manner, to use one material only as Schottky barrier, so that this material forms the layer 16, and, for filling, to use a second metal ply 27 made of an electrically conductively material which produces an ohmic contact with the Schottky contact-forming material.

In this first embodiment of the invention, the pillar structures of the trenches 14 in the drift zone 11 are coupled to the source potential in floating fashion. However, it is also possible. to provide a high-resistance connection to the source potential by means of igzhily doped region which connect the Schottky regions. ln a further embodiment of the invention, it is provided that the material layers 1 of the trench 4 that form Schottky contacts 17 are coupled to one another in floating fashion. By contrast, in a further embodiment of the invention, the material layers 16 of the trenches 14 that form Schottky contacts 17 are coupled to one another via a high-resistance connection layer 30. High-resistance connecting layers 30 of this type may he arranoed both in the top side 18 of the semiconductor body 3 or in the epitaxial layer 5 as a buried layer in the drift zone 11.

Figure 2:
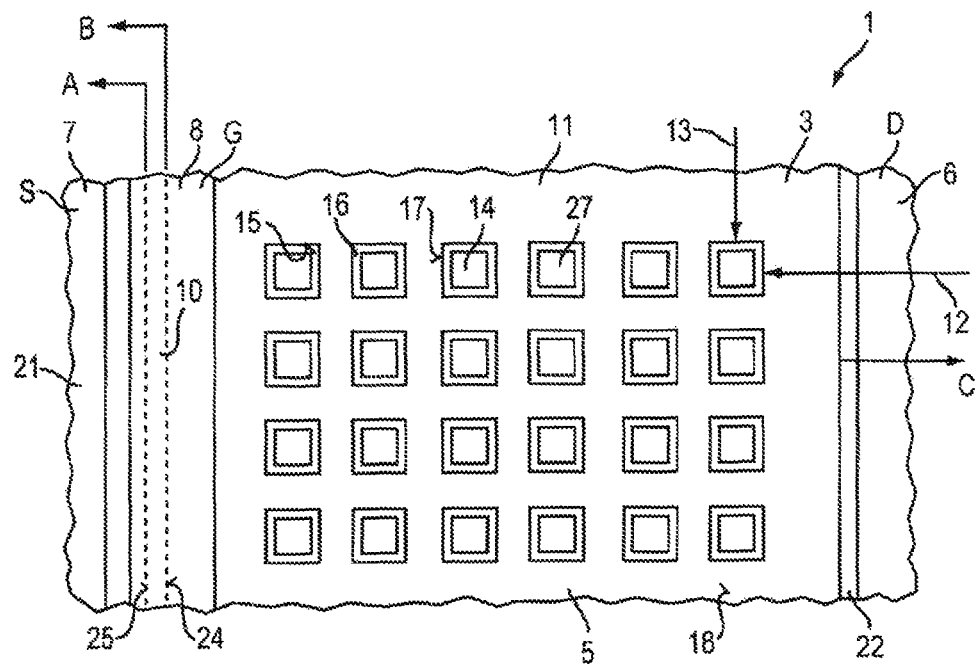
FIG. 2 shows a schematic plan view of the lateral MISFET of FIG. 1.

FIG. 2 shows a schematic plan view of the lateral MISFET 1 of FIG. 1. In order to simplify the illustration, in FIG. 2 only the course of the source electrode, of the gate electrode, of the drain electrode and also the patterning of the drift region 11 are and all further insulation and metal layers which are customary in integrated circuits in order to link a semiconductor component of this type into an integrated circuit are omitted. On the left-hand side of FIG. 2 is shown the gate connection G via the gate electrode 8, which extends in strip-type fashion at the left-hand edge of FIG. 2. A thermally produced oxide patterned in strip-type fashion is arranged beneath the gate electrode 8 as gate insulator 9, which oxide in this example has approximately the same dimensions as the gate electrode 8.

Beneath the gate insulator there extends, as shown in FIG. 1, the semiconductor zone 10, which is also called body zone, and its contour with which it meets the top side 18 of the semiconductor body 3 or the epitaxial layer 5 is identified by the dashed lines 24 and 25 and its width is identified by the arrow B. The body zone 10 is adjoined on the top side 18 of the semiconductor body 3 in arrow direction A by the first highly doped strip-type zone 21, on which is arranged the source electrode 7 with its source connection S. Arranged oppositely on the right-hand side of the illustration of FIG. 2 is the drain electrode 6 with its drain connection C in strip-type form, the highly doped second strip-type zone 22 required for this being identified by a dashed line 26, which simultaneously delimits the drift zone 11 at the right-hand edge of the illustration. The arrow direction C indicates that the second highly doped zone 22 may be greater in its width than is illustrated here beginning with the delimiting line 26.

The drift zone 11 extends between the dashed lines 24 and 26, within which drift zone the trenches 14 shown in FIG. 1 are arranged in rows 12 and columns 13. In this embodiment of the invention, said trenches 14 have a square cross section, but circular, rectangular, oval, or polygonal cross sections may also be provided for the pillar-type trenches 14 in the layout. In this embodiment of the invention, the Schottky contacts 17 are based on a two-layer system. In a first material layer 16, the Schottky contact 17 is produced in relation to the semiconductor material of the epitaxial layer 5 and the pillar-type trenches are filled with a second ply 27 made of conductive material.

Figure 3:
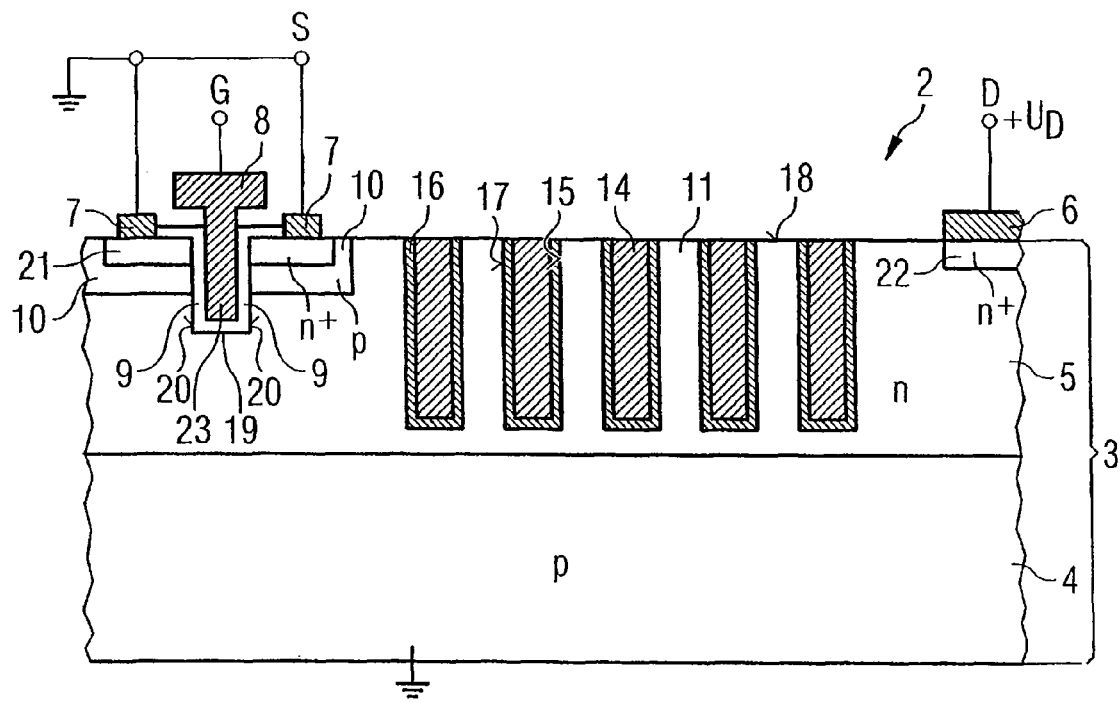
FIG. 3 shows a schematic cross section through a lateral MISFET of a second embodiment of the invention in the form of a MOSFET with a gate trench electrode.

FIG. 3 shows a schematic cross section through a lateral MISFET 2 of a second embodiment of the invention in the form of a MOSFET with a gate trench electrode 23. Components having functions identical to those in the previous figures are identified by the same reference symbols and are not discussed separately. Whereas in the first embodiment a channel is formed below the gate insulator 9 of the gate electrode 8 in the body zone 10, which channel firstly extends horizontally from the first highly doped region 21 having a complementary conduction type to the body zone 10 to the drift zone 11, in the case of a trench gate electrode 23 a vertical channel firstly forms in the body zone 10 between the highly doped source region 21 and the drift zone 11.

On account of the technical boundary conditions, said vertical channel may have a channel length that is an order of magnitude smaller than is technologically possible at the present time in the case of a planar gate electrode. The effectiveness of the MISFET 2 in particular with regard to the turn-on properties can thus be significantly improved by the gate trench electrode 23 shown in FIG. 3. In order to realize a gate trench electrode 23 of this type, a gate trench 19 is introduced through the source region 21 and the body zone 10 right into the drift region 11 and the trench walls 20 are subsequently coated with a gate insulator 9, preferably a thermal silicon dioxide.

Figure 4:
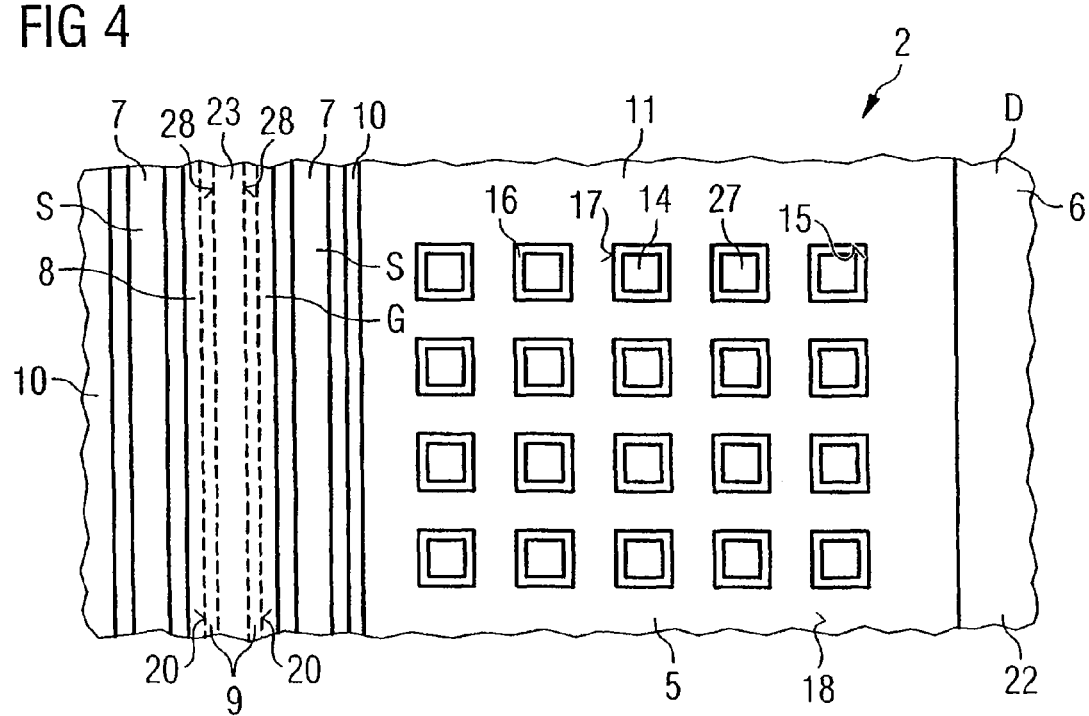
FIG. 4 shows a schematic plan view of the lateral MISFET of FIG. 3.

FIG. 4 shows a plan view of the MISFET 2 of FIG. 3. In this case, the trench walls 20 are identified by dashed lines, and the course of the gate oxide 9 is also identified by corresponding dashed lines in the gate trench electrode 23, the boundary of the trench electrode 23 being identified by the dashed lines 28. The patterning of the drift region with its pillar-type trenches corresponds to the first embodiment of the invention.

Figure 5:
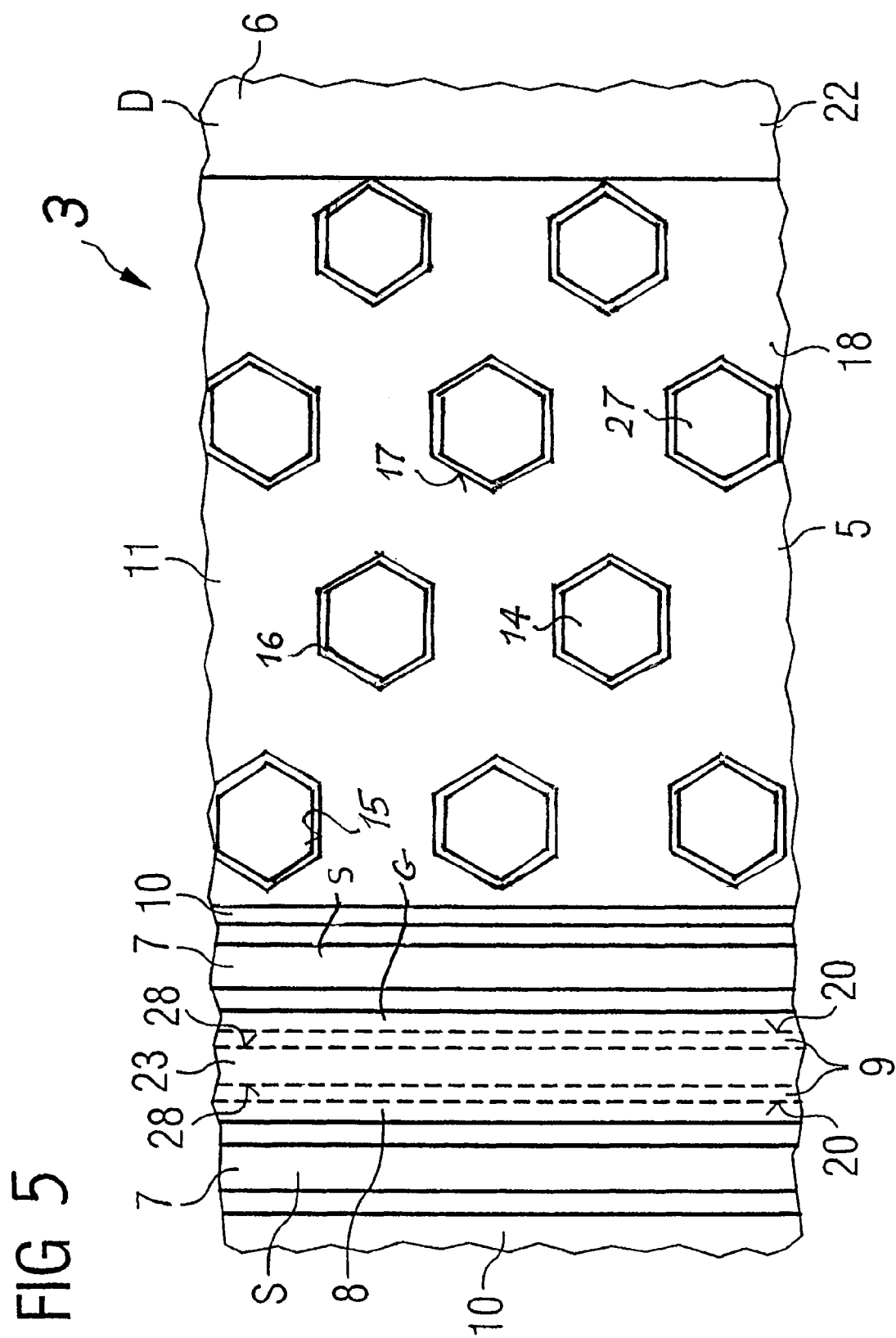
FIG. 5 shows a schematic plan view of a lateral MISFET of a third embodiment of the invention.

FIG. 5 shows a plan view of a lateral MISFET 3 of a third embodiment of the invention. Components having functions identical to those in the previous figures are identified by the same reference symbols and are not discussed separately. The difference between this third embodiment of the invention and the previous embodiments is that the pillar-type trenches 14 have a polygonal cross section, in particular a hexagonal cross section.

Besides the geometrically relatively regular arrangements of the pillar-type trenches 14 as shown in FIGS. 4 and 5, arrangements (not shown) are also possible in which the pillar-type trenches are arranged irregularly or regular arrangement positions are occasionally not occupied.

The invention claimed is:

1. A lateral MISFET having a semiconductor body comprising:
    a doped semiconductor substrate of a first conduction type;
    an epitaxial layer of a second conduction type, which is complementary to the first conduction type, said epitaxial layer being provided on the semiconductor substrate;
    a drain electrode;
    a source electrode;
    a gate electrode arranged adjacent a gate insulator;
    a semiconductor zone of the first conduction type, said semiconductor zone adjoining the gate insulator and being embedded into the epitaxial layer;
    a drift zone of the second conduction type being arranged between the source electrode and the drain electrode in the epitaxial layer; and
    pillar-type regions which are arranged in the drift zone in a plurality of rows and a plurality of columns and physically separated from the substrate by the epitaxial layer, the pillar-type regions having a first metal material layer arranged adjacent a portion of the drift zone to form a respective Schottky contact with a material of the drift zone and a different second metal material layer surrounded by the first metal material layer and which produces an ohmic contact with the first metal material layer.

2. The lateral MISFET according to claim 1, wherein the first metal material layer is in multilayer form and comprises a combination of at least one of metals, silicides and polysilicides.

3. The lateral MISFET according to claim 1, wherein the first metal material layer comprises at least one of aluminum, aluminum silicide, aluminum copper silicide, platinum and platinum silicide when the second conduction type is n-conducting.

4. The lateral MISFET according to claim 1, wherein the material of the drift zone includes ions implanted adjacent the pillar-type regions, so that the difference in the work function of charge carriers between the first metal material layer and the material of the drift zone is higher than without the implanted ions.

5. The lateral MISFET according to claim 1, wherein the pillar-type regions comprise a metal alloy.

6. The lateral MISFET according to claim 1, wherein the pillar-type regions comprise trenches sunk into the drift zone, the trenches having boundary layers as walls with respect to the material of the drift zone.

7. The lateral MISFET according to claim 6, wherein the second metal material layer comprises metal alloys.

8. The lateral MISFET according to claim 1, wherein the first metal material layer of the pillar-type regions is coupled together without physically touching.

9. The lateral MISFET according to claim 1, wherein the first metal material layer of the pillar-type regions is coupled together via a high-resistance connecting layer.

10. The lateral MISFET according to claim 1, wherein the pillar-type regions have a circular, oval, rectangular or polygonal cross section.

11. The lateral MISFET according to claim 1, wherein the gate electrode is arranged in planar fashion on the top side of the semiconductor zone.

12. The lateral MISFET according to claim 1, wherein the gate electrode is formed as a gate trench electrode.

13. The lateral MISFET according to claim 1, wherein the lateral MISFET is a power MOSFET.

14. The lateral MISFET according to claim 1, wherein the semiconductor body of the lateral MISFET comprises silicon.

* * * * *